(12) United States Patent
Shaw et al.

(10) Patent No.: US 9,829,935 B2
(45) Date of Patent: Nov. 28, 2017

(54) SAS INTEGRATION WITH TRAY AND MIDPLANE SERVER ARCHITECTURE

(75) Inventors: Mark Shaw, Sammamish, WA (US); Wilson V. Vu, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1337 days.

(21) Appl. No.: 13/453,478

(22) Filed: Apr. 23, 2012

(65) Prior Publication Data
US 2013/0282944 A1 Oct. 24, 2013

(51) Int. Cl.
| | | |
|---|---|---|
| G06F 13/14 | (2006.01) | |
| G06F 1/18 | (2006.01) | |
| H05K 7/14 | (2006.01) | |
| G06F 13/40 | (2006.01) | |

(52) U.S. Cl.
CPC .............. *G06F 1/183* (2013.01); *G06F 1/186* (2013.01); *G06F 13/409* (2013.01); *G06F 13/4022* (2013.01); *G06F 13/4068* (2013.01); *H05K 7/1438* (2013.01); *H05K 7/1441* (2013.01); *G06F 2213/0028* (2013.01)

(58) Field of Classification Search
CPC .................................. G06F 1/16; H05K 7/16
USPC ........................................... 710/305; 361/725
See application file for complete search history.

(56) References Cited

U.S. PATENT DOCUMENTS

| | | | | | |
|---|---|---|---|---|---|
| 4,658,333 | A * | 4/1987 | Grimes | ..................... | H05K 1/14 361/788 |
| 4,777,615 | A * | 10/1988 | Potash | .................. | G06F 13/409 361/679.31 |
| 5,696,667 | A * | 12/1997 | Berding | ............... | H05K 1/0216 361/777 |
| 5,930,119 | A * | 7/1999 | Berding | ............... | H05K 1/0216 174/117 F |
| 6,201,708 | B1 * | 3/2001 | Lewis | ................. | G06F 13/4018 361/788 |
| 6,289,401 | B1 * | 9/2001 | Tuccio | .................. | G06F 13/409 361/679.31 |

(Continued)

OTHER PUBLICATIONS

Dell, Dell PowerEdge M1000e Modular Enclosure Architecture, Jan. 2008.*

(Continued)

*Primary Examiner* — Steven Snyder
(74) *Attorney, Agent, or Firm* — Liang IP, PLLC

(57) ABSTRACT

In computing scenarios involving multiple computational units, an enclosure (e.g., a rack or server cabinet) may store the units and provide resources such as shared power and network connectivity. Additionally, the components of the units may communicate through a Serial Attached SCSI (SAS) bus, but many such enclosures provide little or no integration with the SAS buses, thus entailing extensive SCSI cabling. Presented herein are architectures for enclosures presenting a set of slots for trays storing respective computing blades, where such trays include SAS connectors that connect directly (i.e., without cabling) with connectors on a midplane that interconnects the blades into a SAS bus featuring at least one integrated SAS expander. Additional architectural variations involve providing SAS expander on one or both of the midplane and the blades; grouping blades into subsets having distinct SAS buses; and interconnecting the SAS buses and expanders of multiple midplanes in the enclosure.

20 Claims, 9 Drawing Sheets

(56) References Cited

U.S. PATENT DOCUMENTS

| | | | | |
|---|---|---|---|---|
| 6,349,037 | B1* | 2/2002 | Draughn | H05K 7/1459 361/785 |
| 7,155,546 | B2* | 12/2006 | Seto | G06F 13/409 710/100 |
| 7,162,654 | B1* | 1/2007 | Price | G06F 1/30 326/30 |
| 7,227,758 | B2* | 6/2007 | Brandenburg | H01R 13/6658 361/774 |
| 7,275,935 | B2* | 10/2007 | Chen | G06F 13/409 361/788 |
| 7,339,786 | B2* | 3/2008 | Bottom | H04L 49/351 361/679.41 |
| 7,373,442 | B2* | 5/2008 | Seto | G06F 13/409 710/100 |
| 7,516,272 | B2* | 4/2009 | Felton | G11B 33/126 711/112 |
| 7,583,507 | B2* | 9/2009 | Starr | G11B 33/128 361/725 |
| 7,584,319 | B1 | 9/2009 | Liao | |
| 7,597,582 | B2* | 10/2009 | Nehling et al. | 439/490 |
| 7,916,423 | B2* | 3/2011 | Starr | G11B 33/125 360/92.1 |
| 8,009,385 | B2* | 8/2011 | Starr | G11B 33/125 360/98.01 |
| 8,107,256 | B1* | 1/2012 | Kondrat et al. | 361/796 |
| 8,410,364 | B2* | 4/2013 | Dunwoody | H05K 7/1491 174/68.1 |
| 8,670,241 | B2* | 3/2014 | Sherrod | H05K 7/1488 361/725 |
| 8,948,166 | B2* | 2/2015 | Leigh | H04L 49/00 370/386 |
| 9,001,514 | B2* | 4/2015 | Rust | G11B 33/128 361/727 |
| 9,098,233 | B2* | 8/2015 | Keffeler | G11B 33/128 |
| 2004/0111559 | A1* | 6/2004 | Heil | G06F 9/4405 711/114 |
| 2005/0138258 | A1* | 6/2005 | Seto | G06F 13/409 710/301 |
| 2006/0136644 | A1* | 6/2006 | Martin | G11B 33/12 710/302 |
| 2006/0194460 | A1* | 8/2006 | Chen | G06F 13/409 439/108 |
| 2007/0022189 | A1* | 1/2007 | Nguyen | H04L 67/1097 709/223 |
| 2007/0047536 | A1* | 3/2007 | Scherer | H04L 49/358 370/360 |
| 2007/0067537 | A1* | 3/2007 | Seto | G06F 13/409 710/301 |
| 2007/0083707 | A1* | 4/2007 | Holland | G06F 3/0626 711/114 |
| 2007/0230109 | A1* | 10/2007 | Starr | G11B 33/128 361/679.31 |
| 2007/0230110 | A1* | 10/2007 | Starr | G11B 33/10 361/679.31 |
| 2007/0230111 | A1* | 10/2007 | Starr | G11B 33/125 361/679.31 |
| 2007/0233781 | A1* | 10/2007 | Starr | G11B 33/126 709/203 |
| 2007/0233916 | A1* | 10/2007 | Seto | G06F 13/409 710/100 |
| 2007/0266192 | A1* | 11/2007 | Campini | G06F 13/409 710/301 |
| 2008/0040463 | A1* | 2/2008 | Brown | H04L 41/12 709/223 |
| 2008/0126582 | A1* | 5/2008 | Holland | G06F 13/409 710/6 |
| 2008/0126635 | A1* | 5/2008 | Kawai | G11B 33/125 710/105 |
| 2008/0140930 | A1* | 6/2008 | Hotchkiss | G06F 3/0605 711/114 |
| 2008/0165490 | A1 | 7/2008 | Buckland | |
| 2009/0172206 | A1* | 7/2009 | Hall, IV | G06F 13/4081 710/10 |
| 2009/0268390 | A1* | 10/2009 | King | G06F 13/409 361/679.33 |
| 2009/0307513 | A1* | 12/2009 | Kinouchi | 713/324 |
| 2010/0064084 | A1 | 3/2010 | Johnson | |
| 2010/0296815 | A1* | 11/2010 | Petty et al. | 398/116 |
| 2011/0141874 | A1* | 6/2011 | Starr | G11B 33/125 369/212 |
| 2011/0219158 | A1 | 9/2011 | Davis | |
| 2012/0185626 | A1* | 7/2012 | Stuhlsatz | G06F 13/4022 710/105 |
| 2013/0010419 | A1* | 1/2013 | Armstrong | H04L 41/0668 361/679.31 |
| 2013/0010639 | A1* | 1/2013 | Armstrong | H04L 41/24 370/254 |
| 2013/0013957 | A1* | 1/2013 | Armstrong | H04L 41/0654 714/4.12 |
| 2013/0019045 | A1* | 1/2013 | Andresen et al. | 710/313 |
| 2013/0155604 | A1* | 6/2013 | Lin | 361/679.37 |
| 2013/0265725 | A1* | 10/2013 | Harvilchuck | G06F 1/181 361/720 |
| 2013/0335907 | A1* | 12/2013 | Shaw et al. | 361/679.31 |
| 2014/0281094 | A1* | 9/2014 | Nelson | G06F 1/183 710/301 |

OTHER PUBLICATIONS

'Redundant Midplane in a Blade System' forum discussion at Hewlett Packard Enterprise Community, Mar. 25, 2008.*
'Implementing the IBM BladeCenter S Chassis' Redpaper by IBM, Dec. 2007.*
'Blade Systems and Modular Computing,' copyright 2003, John Harker.*
'The Benefits of Serial Attached SCSI (SAS) for External Subsystems' White Paper from Adaptec, copyright 2006.*
'Orthogonal Backplane Connector Technology Offers Design Flexibility' by Kevin O'Connor, Molex Incorporated, Dec. 7, 2010.*
Brett, et al., "SAS Sharpens Blade Servers" Retrieved Date: Jan. 13, 2012, pp. 1-10, http://rtcmagazine.com/articles/view/100912.
Bobholz, Susan, "SAS—a Sharable, Scalable Storage Technology"—Published Date: Mar. 7, 2008, pp. 1-7, http://www.scsita.org/serial-storage-wire/sas/scalability/.
"12-Port 3Gb/s SAS Expander"—Retrieved Date: Jan. 13, 2012, pp. 1-2, http://www.lsi.com/downloads/Public/SAS%20Expander%20ICs/LSISASx12/lsisasx12_pdf.
"SAS Connectivity Module and SAS (CFFv) Expansion Card for IBM Blade Center Increasing blade connectivity and performance"—Published Date: Sep. 18, 2007, pp. 1-9, http://www-01.ibm.com/common/ssi/rep_ca/5/897/ENUS107-575/ENUS107575.PDF.

* cited by examiner

SAS INTEGRATION WITH TRAY AND MIDPLANE SERVER ARCHITECTURE

BACKGROUND

Within the field of computing, many scenarios involve a multi-blade computational unit architecture comprising a support structure configured to store a set of modular computing units. As a first example, a rack server may comprise a set of racks, each sized to hold a computational unit, such as a cased or caseless mainboard including a processor, memory, a power supply, and one or more storage devices, network adapters, and other expansion cards. The mainboard may include a power supply having a power inlet (usually positioned toward the back of the unit) that may be attached to a power outlet of the rack via a power cable, and a network port that may be attached to a network port of the rack using a network cable. As a second example, a blade server may comprise a set of slots, wherein a structural unit may comprise a set of parallel slots respectively configured to receive a computational unit of a "blade" form factor (e.g., a thin, substantially planar array of computational components). The enclosure may therefore store a horizontal or vertical stack of blades, each having an array of components, such as a processor, memory, a storage device, and a power supply, and may provide other services (such as power and network access) through cable attachments to various ports and outlets provided in the enclosure.

In these and other examples, the computational units comprising the server may be managed in various ways. For example, an individual computational unit may be removed from the rack or enclosure and attached to an external set of input and output devices to interact with an operating system and examine or alter the configuration of the computational unit. Alternatively, the individual computational units may enable external interaction; e.g., a terminal services solution may enable a user to interact with the operating system of a computational unit within a shell presented on a second device, and a remote management daemon may provide information about the configuration and status of a computational unit for presentation on a second device. In these and other scenarios, users may query and administer respective computational units of the multi-blade computational unit.

Additionally, in many computing scenarios, a set of storage devices may be coupled with a set of computers through many types of serial and/or parallel buses, such as a Universal Serial Bus (USB), an Advanced Technology Attachment (ATA) bus, and a Small Computer System (SCSI) bus. In particular, a Serial Attached SCSI (SAS) bus may comprise a set of devices connected to a SAS interface, and SAS interfaces may be interconnected through one or more SAS expanders. The connections among these devices may be achieved through SCSI cables that connect the devices in series, often ending with a SCSI terminator to improve the directionality of the signal along the SCSI pathway.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

Some architectural models and management interfaces for multi-blade computational units may present some or all of several disadvantages. As a first example, such systems often utilize cabling to connect the power, network, and other components of a computational unit to the respective sources of such services. While the use of standardized cabling may present broad compatibility for such connections, the cables depend on manual connection to the inlets of the unit; may represent a point of failure; and may clutter the confines of the rack or enclosure that interferes with airflow. As a second example, a rack or blade enclosure may store and provide supporting services for a set of individual computational units, but may provide little or no integration or synergy of the individual computational units; e.g., a rack may enable a set of computational units to operate independently, but may not particularly facilitate the interoperation or management of the array of computational units. As a third example, such enclosures may provide little or no support for buses used to interconnect storage devices, processors, and communication components. For example, computers and storage devices stored in a rack may share a SAS bus through extensive dedicated SAS cabling spanning all of the devices, or may utilize standard network connectors that involve encoding SAS requests over network protocols such as TCP/IP, thus significantly diminishing the throughput of data, the bandwidth of the network, and the performance of the computers.

Presented herein are configurations of a multi-blade computational unit architecture involving a chassis comprising a number of slots respectively configured to support an insertable tray hosting one or more blades comprising a set of blade components. The tray provides one or more blade SAS connectors, and the chassis comprises a midplane including a midplane SAS connector that directly couples with each blade SAS connector (without SAS cabling) to provide a SAS bus that is integrated with the chassis and trays. Moreover, one or more SAS expanders are included in the SAS bus in the midplane and/or one or more trays to create various types of SAS buses (e.g., variable numbers of lanes and interconnections among blades, thus presenting various tradeoffs of performance and cost). Several architectural variations presented herein enable a set of SAS topologies that may serve various computing scenarios according to the techniques presented herein.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
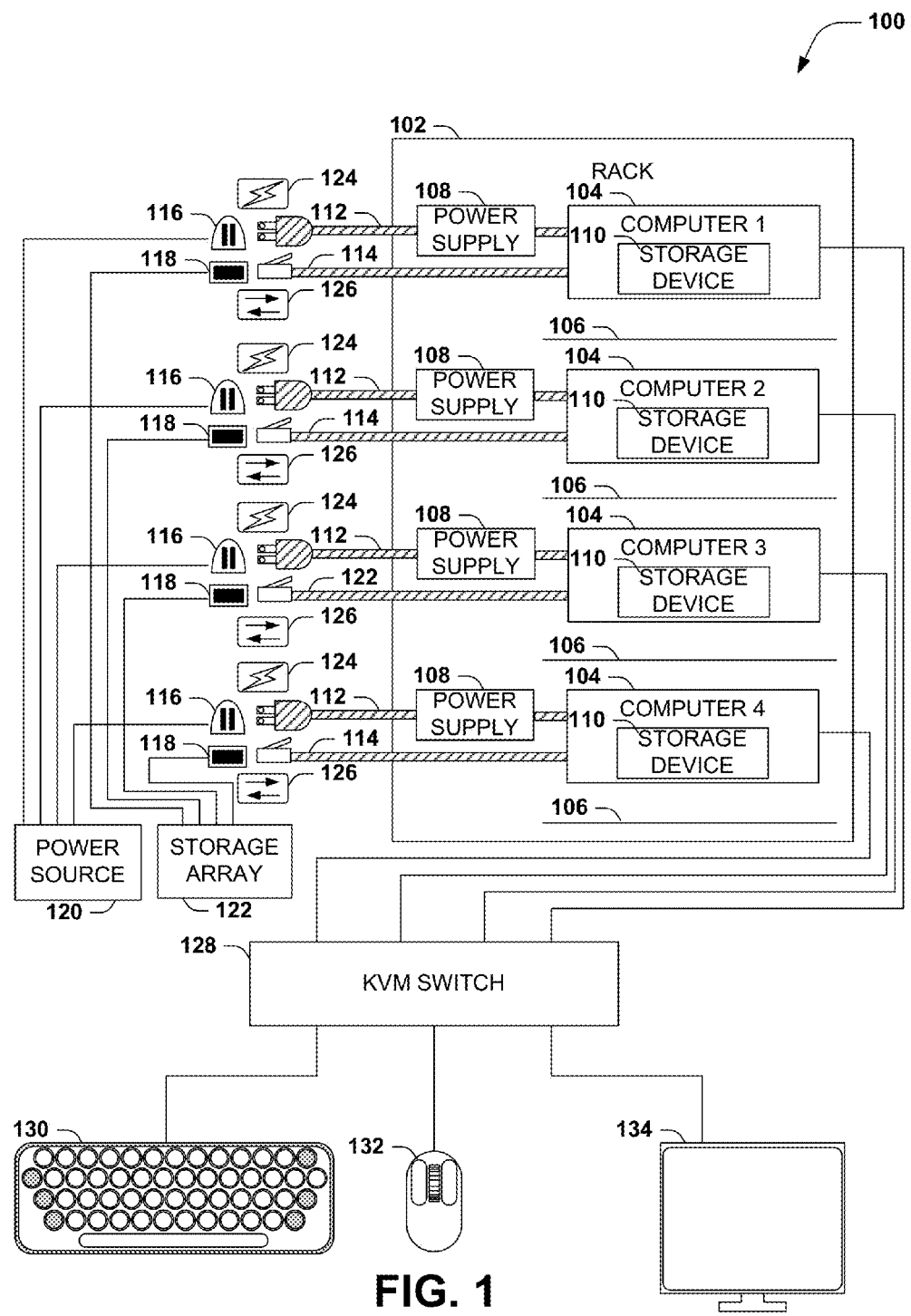
FIG. 1 is an illustration of an exemplary scenario featuring a rack configured to store computational units of a multi-blade computational unit.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are shown in block diagram form in order to facilitate describing the claimed subject matter.

A. Introduction

Within the field of computing, many scenarios involve a plurality of computational units stored together in an enclosure, such as a rack or cabinet. As a first example, the computational units may comprise a set of independently operable computers configured to intercommunicate to achieve a task in a cooperative manner, such as a server farm or a peer-to-peer processing network. As a second example, the computational units may comprise processors and/or storage arrays that are coordinated by a coordinating module, such as in a symmetric multiprocessor (SMP) model. As a third example, the computational components may autonomously process data, but may share resources such as input/output components, such as a rack server comprising a set of mainboards and a switch configured to enable user interaction with a single mainboard. In these scenarios, the enclosure may comprise a set of resources to provide various functionality (e.g., power supplies that supply power to the computational units; climate components (e.g., fans, heatsinks, air conditioners, heaters, humidifiers, and dehumidifiers) that regulate the temperature, humidity, and/or airflow of the components; communication components, such as wired and/or wireless network adapters and network switches; user input components, such as keyboards, mice, microphones, and cameras; user output components, such as displays, speakers, and printers; and physical protection, such as enclosures and physical locks. In various scenarios, each computational unit may have a dedicated resource (e.g., each computer may have a separate enclosure and dedicated input/output devices), or a resource may be shared among two or more computational units (e.g., in a rack server, each computational unit may have a dedicated processor and volatile storage, and may provide a pool of nonvolatile storage, such as a redundant array of inexpensive disks (RAID) unit, that is shared by all of the units for nonvolatile storage). Additionally, the degree of integration of the computational units may vary in different server scenarios from complete independence (e.g., units that provide independent functions and that seldom intercommunicate, or are even isolated from each other; units that operate independently but intercommunicate to achieve a particular task; or units that are incapable of independent operation without direction from a management module).

FIG. 1 presents an illustration of an exemplary scenario 100 featuring a multi-unit rack server, comprising a rack 102 configured to store a set of computers 104 on a vertical array of shelves 106. In this exemplary scenario 100, each computer 104 is connected to a power supply 108 stored on the shelf 106 and attached to the computer 104 via a power cable 112, and comprises an enclosure featuring a complete set of computational components, such as one or more processors and a storage component 110. In addition to providing a physical structure and organization of the computers 104, the rack 102 comprises a set of standard power outlets 116, into which a power cable 112 of the power supply 108 may be inserted to receive power 124 from a power source 120, thus enabling any computer 104 to be powered through its ordinary power supply 108. The computers 104 may also include communications components, such as an Ethernet network adapter that connects through a network cable 114 and a network port 118 to a network in order to enable intercommunication with other network components, such as other computers 104 and a storage array 112 accessible over the network (e.g., a network attached storage ("NAS") device). The rack 102 may also include a keyboard/video/mouse ("KVM") switch 128, to which are connected a keyboard 130, mouse 132, and video display 134, as well as one or more connections with respective computers 104 (e.g., a High Definition Multimedia Interface (HDMI) cable or a Universal Serial Bus (USB) cable). The switch 128 may present a toggle that enables the connection of these devices to any computer 104 positioned in the rack 102. By presenting these components in addition to the physical structure and organization of the shelves 106, the rack 102 therefore supports the functioning, interoperation, and resource-sharing of the computers 104 stored therein.

Additionally, respective computational units stored within an enclosure may utilize, and occasionally share, a bus that enables intercommunication of a set of components. These buses may operate in serial and/or parallel, and may connect a variety of components, such as nonvolatile storage devices, network adapters, display adapters, cameras, and speakers. Such examples include a Universal Serial Bus (USB), an Advanced Technology Attachment (ATA) bus, and a Small Computer System (SCSI) bus. In particular, a Serial Attached SCSI (SAS) bus may comprise a set of devices connected to a SAS interface operating as a controller of the SAS bus. Additionally, two or more SAS interfaces may be interconnected through one or more SAS expanders. The connections among these devices may be achieved through SCSI cables that connect the devices in series, often ending with a SCSI terminator to improve the directionality of the signal along the SCSI pathway.

Figure 2:
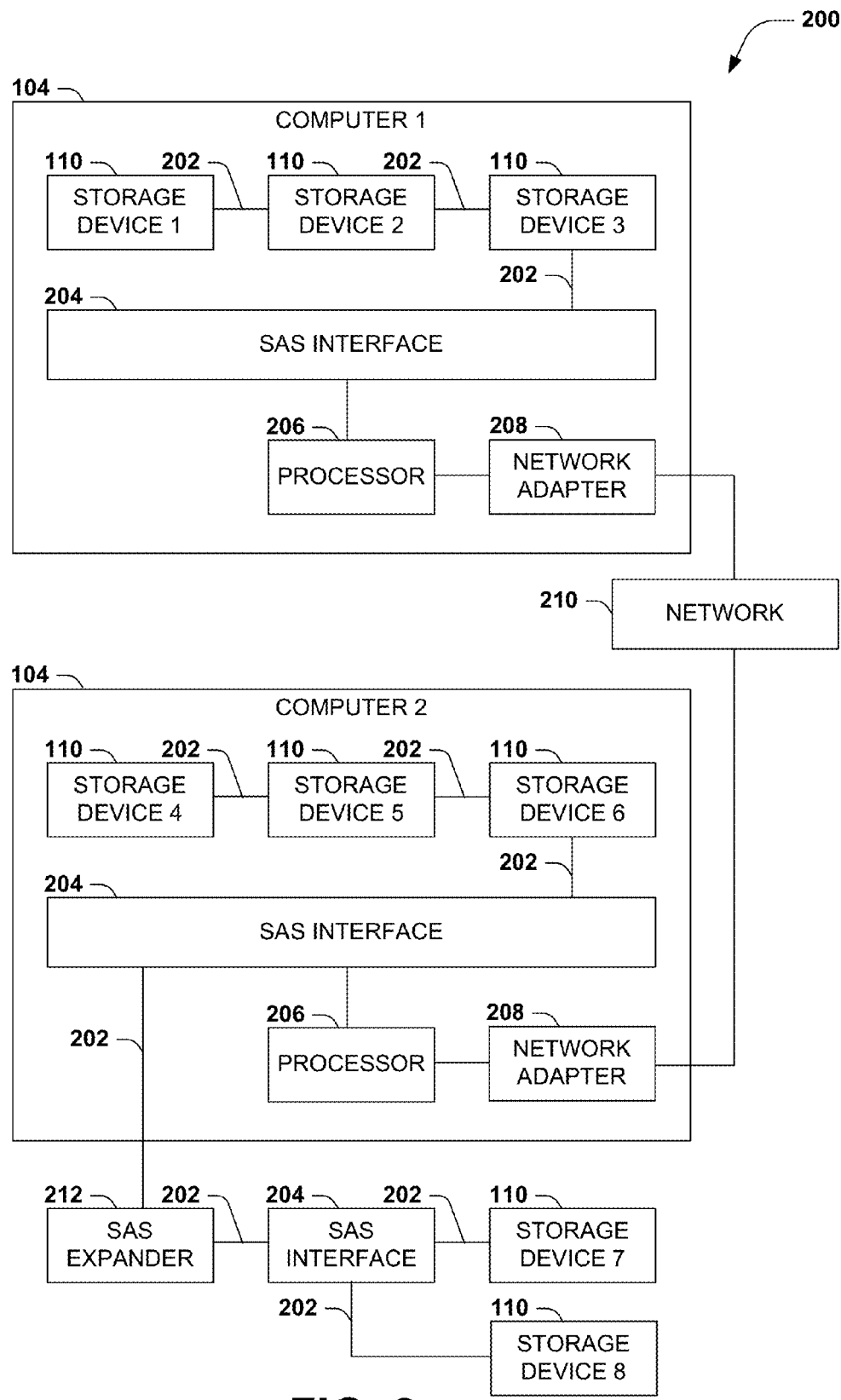
FIG. 2 is an illustration of an exemplary Serial Attached Small Computer System Interface (SAS) bus generated among a set of storage devices and processors.

FIG. 2 presents an illustration of an exemplary scenario 200 featuring a set of computers 104 utilizing SAS buses to connect the components of respective computers 104. In this exemplary scenario 200, two computers 104 are provided that store a set of storage devices 110 to be connected to a processor 206 of the computer 104. In order to enable high throughput and manageability of the storage devices 110, each computer 104 implements a SAS bus by connecting the storage devices 110 in series (using SCSI cabling 202) to a SAS interface 204 that coordinates communication along the SAS bus, and that is connected to the processor 206 (e.g., through a mainboard circuit) to enable access to the storage devices 110. The computers 104 are also interconnected via a network 210, such that one computer 104 may share its storage devices 110 with the other computer 104 over the network 210. However, interlinking the first computer 104 with the storage devices of the second computer 104 through the network 210 may entail various inefficiencies (e.g., translating SAS commands and accessed data to network requests and packets, and passing all such requests and data through the processor 206 of the second computer 110) that significantly increase latency and reduce throughput. Alternatively, the second computer 104 may also connect with a set of external storage devices 110 that are not directly coupled with the second computer 104 (e.g., the external storage devices may be accessible by several computers 104) by extending the SAS bus within the computer 104 to include the external storage devices 110. In particular, the SAS interface 204 of the second computer 104 is connected via SCSI cabling 202 to a SAS expander 212, which is further connected to another SAS interface 204 that is connected to the external storage devices 110. In this manner, the SAS expander 212 may extend the internal SAS bus of the second computer 104 to include an external set of devices, and may support such configurations by providing services for the connected devices such as routing and link allocation.

The multi-computer enclosure design presented in the exemplary scenario 100 of FIG. 1 and the SAS bus topology in the exemplary scenario 200 of FIG. 2 present some advantageous features of contemporary computer architectures. However, in many scenarios, the enclosure and the bus are implemented as separate architectural features. In particular, the enclosure provides little or no support for or integration of the bus shared by the computers 104 stored within the enclosure. The computers 104 may be positioned on the shelves 106 of the rack 102, and then separately interconnected with SAS cabling 202 to create one or more SAS buses, but the rack 102 is not physically configured to facilitate such interconnections. Additionally, the ports of respective computers 104 in the rack 102 (such as the port for the power adapter 108) are often positioned at the back of the computer 104, and connecting these ports to the power outlet 116 of the rack 102 may be difficult (e.g., the user may have difficulty seeing and/or reaching the ports behind the computer 104). The power cables 112 and SCSI cabling 202 also consume space within the rack 102; involve extra resource costs; and/or represent additional points of failure of the computer set. These and other disadvantages may result from racks 102 and other enclosures of multi-blade computational units.

B. Presented Techniques

Presented herein are architectures for multi-unit enclosure and communications buses that enable various advantages with respect to other architectures, including the rack 102 in the exemplary scenario 100 of FIG. 1 and the SAS bus in the exemplary scenario 200 of FIG. 2. In the techniques presented herein, the enclosure comprises a set of slots, and a set of computational units (a "blade") are stored in a tray that may be inserted into a slot of the enclosure. The enclosure also stores a midplane that connects to each blade and provides interconnections, such as power and network communication. In particular, the tray includes a tray SAS connector for each blade that, when the tray is inserted into a slot, connects directly with a midplane SAS connector of the midplane. Additionally, one or both of the midplane and the blade may include a SAS expander 212 that provides expansion services (such as routing) among the SAS interfaces 204 of one or more blades. This architecture achieves the creation of a SAS bus among the blades and the midplane with integrated SAS expansion to enable a flexible addition of components to the SAS bus. Additionally, the SAS interfaces 204 within the trays are connected to the tray SAS connector, the tray SAS connector is connected directly to the midplane SAS connector, and the midplane SAS connectors for respective blades are interconnected by traces on the midplane. These connections enable the architecture to create a SAS bus with reduced or even eliminated SCSI cabling 202, thus reducing cost, bulk, and complexity as compared with SAS buses using SCSI cabling 202 for every interconnection.

C. Primary Embodiments

Figure 3:
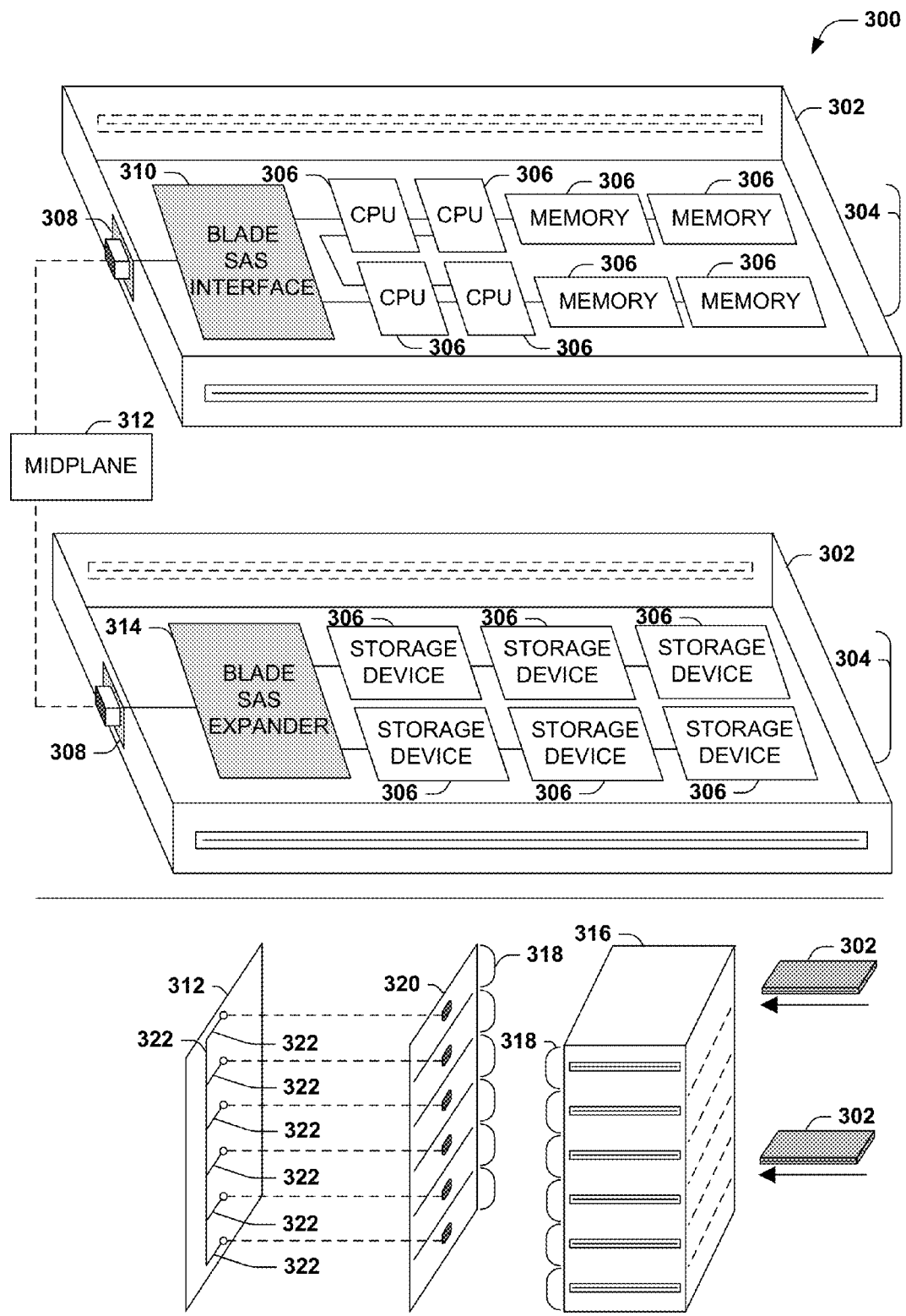
FIG. 3 is an illustration of a first exemplary architecture comprising a chassis storing a midplane connecting with a set of slots respectively storing a tray comprising at least one blade according to the techniques presented herein.
Figure 4:
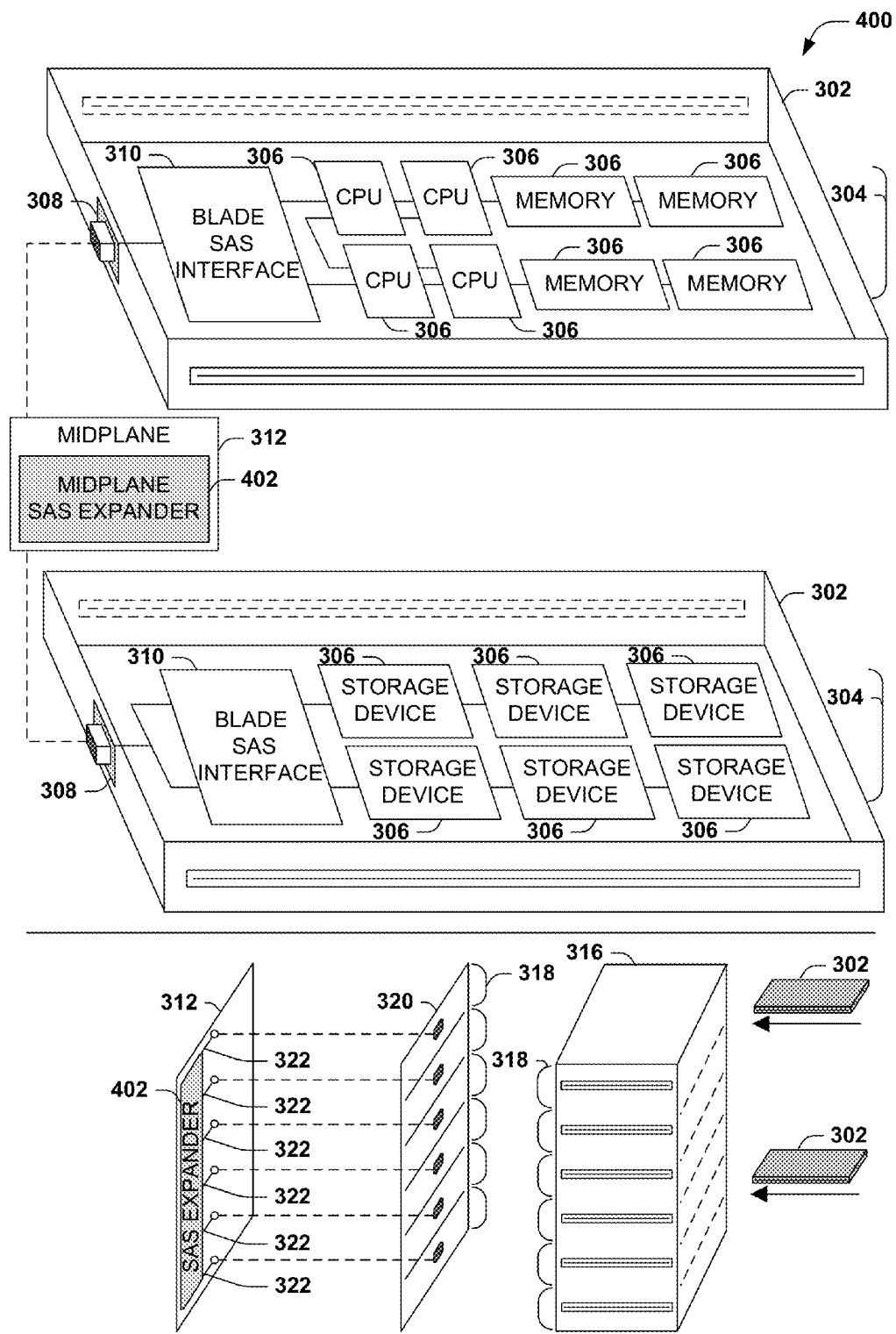
FIG. 4 is an illustration of a second exemplary architecture comprising a chassis storing a midplane connecting with a set of slots respectively storing a tray comprising at least one blade according to the techniques presented herein.

Presented herein are several architectures that may achieve the integration of a SAS bus with an enclosure 102. Each of these architectures includes at least one SAS expander 212 in one or both of a tray or the midplane. FIGS. 3 and 4 present two primary embodiments that, respectively, feature a SAS expander 212 integrated in respective blades and in the chassis.

In a first embodiment of these techniques, the computational units may be stored in a tray that is usable with an enclosure having a midplane. The tray may comprise at least blade respectively comprising blade components including at least one SAS interface, and at least one blade SAS connector connected to at least one blade component. The midplane may be stored in an enclosure comprising a set of slots that respectively store trays. In particular, for respective slots, the midplane may include a midplane SAS connector that, upon insertion of a tray into the slot, directly couples with the blade SAS connector of the blade. The midplane may also comprise traces coupling the midplane SAS connectors of respective trays, thereby interconnecting the SAS interfaces of respective blades to create a SAS bus. Moreover, at least one blade may include a blade SAS expander to provide expansion of the SAS bus.

FIG. 3 presents an illustration of an exemplary scenario 300 featuring this first exemplary tray-and-midplane architecture of a SAS-integrated enclosure. In this exemplary scenario 300, respective computational units, each comprising a blade 304 of a multi-unit server, are stored as a set of blade components 306 in a tray 302. The blades 304 may be of variable types, including a processing blade comprising computational blade components 306 such as microprocessors and volatile memory circuits; a storage blade comprising nonvolatile storage blade components 306 such as hard disk drives and solid-state storage devices; a communications blade comprising communication blade components 306 such as network adapters and network switches; and a mixed blade comprising a variety of such blade components 306. Moreover, respective blades 304 may comprise (as a blade component 306) a blade SAS interface 310, such as a SAS adapter that may enable a processor and/or a set of nonvolatile storage devices to form or join a SAS bus; and at least one blade 304 may comprise a blade SAS expander 314 that provides expansion of the SAS bus. An enclosure 316 may provide a midplane 312 that connects with respective blades 304 in order to interconnect the blade SAS interfaces 310 and blade SAS expander(s) 314. To this end, the enclosure 316 provides a series of slots 318 into which a tray 302 may be inserted. In particular, the trays 302 include, for respective blades 304, a blade SAS connector 308 that is connected with the blade SAS interface 310 and/or blade SAS connector 308, and that, upon insertion into a slot 318, connects directly (i.e., without SCSI cabling 202) with a midplane SAS connector 320 provided within the slot 318, and the midplane SAS connectors 320 may be interconnected through the midplane 312 (e.g., by traces 322 embedded in the midplane 312 and creating a circuit among the midplane SAS connectors 320). In this manner, the connected sequence of the blade components 306 of respective blades 304, the blade SAS interfaces 310, the blade SAS connectors 308, the midplane SAS connectors 320, and the traces 322 of the midplane 312 create a completely interconnected SAS bus, with at least one blade SAS expander 314 included in the circuit to provide an expansion of the SAS bus.

A second embodiment of these techniques may also comprise a tray storing at least one blade respectively comprising a set of blade components including at least one SAS interface and a blade SAS connector connected to at least one blade component of the blade. The trays may be insertable into slots of an enclosure storing a midplane, such that, upon insertion of a tray into the slot, a midplane SAS connector positioned within the slot directly couples with the blade SAS connector of the blade. However, in this second embodiment, the midplane features a midplane SAS expander that is connected (e.g., via traces) to the midplane SAS connectors, thus enabling the expansion of the SAS bus through the integrated components of the enclosure.

FIG. 4 presents an illustration of an exemplary scenario 400 featuring this second exemplary tray-and-midplane architecture of a SAS-integrated enclosure. In this exemplary scenario 400, a tray 302 is provided to store a blade 304 comprising a set of blade components 306, including a blade SAS interface 310 that is connected with a blade SAS connector 308 of the tray 302. The enclosure 316 again provides a midplane 312 and a series of slots 318, and upon insertion of a tray 302 into a slot 318, the blade SAS connectors 308 of the blades 304 of the tray 302 are connected directly (i.e., without SCSI cabling 202) with a midplane SAS connector 320 within the slot 318. However, in this exemplary scenario 400, the midplane 312 interconnects midplane SAS connectors 302 through a midplane SAS expander 402 to enable expansion of the SAS bus. In this manner, the connected sequence of the blade components 306 of respective blades 304, the blade SAS interfaces 310, the blade SAS connectors 308, the midplane SAS connectors 320, and the midplane SAS expander 402 create a completely interconnected SAS bus with integrated expansion capabilities.

C. Variations

The SAS-integrated midplane and tray architectures presented herein may be implemented with variations in many aspects, and some variations may present additional advantages and/or reduce disadvantages with respect to other variations of these and other architectures and implementations. Moreover, some variations may be implemented in combination, and some combinations may feature additional advantages and/or reduced disadvantages through synergistic cooperation.

C1. Scenarios

A first aspect that may vary among embodiments of these techniques relates to the scenarios wherein such techniques may be utilized.

As a first variation of this first aspect, the tray and enclosure architectures may implement many types of multi-blade computational units, such as file servers, webservers, database servers, and distributive processing servers. Additionally, the blades 304 of the multi-blade computational units may operate with varying types and degrees of interoperability (e.g., a mutually isolated set of blades 304; an intercommunicating set of independent blades 304 interacting in a peer-to-peer or server-client model; and a tightly coupled set of computational units, such as a symmetric multiprocessing (SMP) server).

As a second example of this third aspect, respective trays 302 may store blade components 306 that together comprise a blade type of the blade 304. As a first such example, a processing blade type may comprise blade components 306 such as microprocessors, field-programmable gate arrays (FPGAs), and volatile memory components providing working memory storage, that together provide processing capabilities for the multi-blade computational units. As a second such example, a storage blade type may comprise blade components 306 such as nonvolatile storage devices (e.g., hard disk drives, solid-state storage devices, and magnetic and/or optical disks), that together provide nonvolatile storage for the multi-blade computational unit. The storage blade components 306 may also include a storage array controller that aggregates two or more storage devices into a storage array with various features, such as increased capacity, increased throughput, increased reliability, and/or versioning, such as may be provided by various configurations of a Redundant Array of Inexpensive Disks (RAID) storage pool. As a third example, a mixed blade type may comprise blade components 306 providing both processing capabilities and storage capabilities. Still further blade types may provide more specialized capabilities (e.g., processing blade types particularly configured to provide database processing, web service, or media encoding or decoding) and/or other capabilities (e.g., a network switch blade type comprising one or more network switches that provide network routing and filtering capabilities for one or more blades 304 stored within the enclosure 316).

As a third variation of this first aspect, the midplane 312 may be integrated with the enclosure 316, and may be mounted (fixedly or removably) in various portions of the enclosure 316, such as a back wall or a side wall. Alternatively, the midplane 312 may be integrated with a (fixed or removable) chassis mounted within the enclosure 316. As still another alternative, part or all of the midplane 312 may be integrated with a tray 302.

As a fourth variation of this first aspect, the trays 302 may contain blade components 306 in many ways. As a first such example, the trays 302 may be user-serviceable, and may permit the addition and removal of blade components 306, e.g., through a snap-type model that enables blade components 306 to be manually "snapped" or depressed onto and/or manually detached from respective portions of a mainboard. As a second such example, the tray 302 may be manufactured and provided within a fixed enclosure, such that the blade 304 is protected from physical shock and physical intrusion or manipulation. As a third such example, the tray 302 may include two or more blades 304, each comprising a discrete set of blade components 306 and having a separate blade SAS interface 310 and blade SAS connector 308. In one such embodiment, a tray 302 may be apportioned into at least two tray blade regions, each storing the blade components 306 of a blade 304. In this manner, multiple blades 304 may be provided in a single tray 302 to increase the number of blades 304 of the multi-blade server stored in the enclosure 316.

As a fifth variation of this first aspect, the trays 302 and enclosure 316 may utilize many types of connectors for the blade SAS connector 308 and the midplane SAS connector 320. For example, a "blind mate" connector design enables the coupling of the connectors on the back of a tray 302 with the corresponding connectors at the back of a slot 318 of the enclosure 316 without manual intervention. As an example of such a connector, the respective connectors may comprise magnetic plates of opposing polarity that establish and maintain contact through weak magnetic attraction, and thus pair to transmit an electric signal. Additionally, the SAS connector may be integrated with other types of connectors providing other services to the blades 304, such as power connectors supplying power to the blade components 306 and network connectors providing network connectivity to the blade 304. For example, a single connector on the tray 302 may include pins for the blade SAS connector 308, blade power, and blade network connectivity for one or more blades 304, and a connector in the slot 318 that directly connects with the tray connector may include pins for the midplane SAS connector 320, power supply, and network connectivity to a network source, thus providing many services to the blades 304 of the tray 302 in a single pair of directly coupling connectors. These and other scenarios may include an implementation of the SAS-integrated tray-and-midplane architectures presented herein.

C2. SAS Bus Architecture

A second aspect that may vary among embodiments of these techniques relates to variations in the architecture of the SAS bus. The techniques presented herein involve blade components 306 connected to a blade SAS interface 310, which is in turn connected to a blade SAS connector 308 that couples directly with a midplane SAS connector 320 (upon insertion of the tray 302 into a slot 318 of the enclosure 316); a midplane 312 interconnecting the midplane SAS connectors 320 for respective blades 304; and at least one SAS expander 212 integrated with a blade 304 and/or the midplane 312. However, this combination of components may vary in many respects, many of which are presented in the schematics of FIGS. 5-8.

Figure 5:
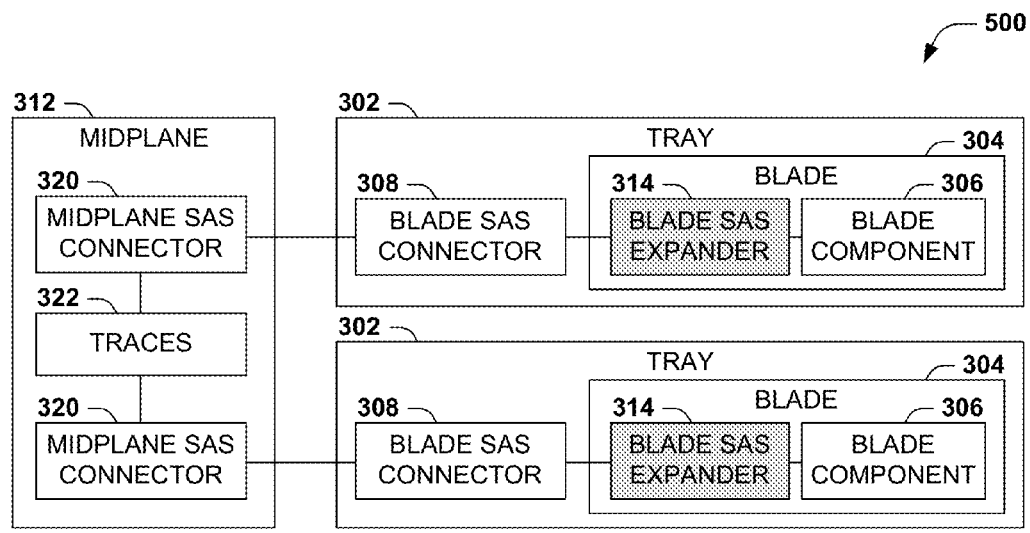
FIG. 5 is an illustration of an exemplary architectural schematic presenting a SAS topology involving blade SAS expanders provided as blade components of respective blades and interconnected through midplane traces.

As a first variation of this second aspect, FIG. 5 presents a first exemplary architecture, wherein the SAS expander 212 is included as a blade SAS expander 314 as a blade component 306 of a blade 304 (e.g., replacing the blade SAS interface 310). In the exemplary scenario 500 of FIG. 5, two trays 302 are presented that respectively store the blade components 306 of a blade 304, and each blade 304 includes a blade SAS expander 314. The blade SAS expander 314 is connected to a blade SAS connector 308, which, upon insertion of the tray 302 into a slot 318 of the enclosure 316, couples directly with a midplane SAS connector 320 within the slot 318. The midplane SAS connectors 320 are interconnected via traces 322 on the midplane 312 included in the enclosure 316. In this manner, the blade SAS expanders 314, blade SAS connectors 308, midplane SAS connectors 320, and traces 322 of the midplane 312 form a SAS bus to interconnect the blade components 306 of the blades 304. This architecture may be advantageous, e.g., where the enclosure primarily comprises storage blades that include (as blade components 306) a large set of storage devices respectively comprising a large number of storage devices that are to be connected through the SAS bus with at least one other blade component 306 of at least one other blade 304, such that the blade SAS expander 314 of each blade may more efficiently route requests to the large number of storage devices than a centrally positioned midplane SAS expander 402.

Further variations of this first exemplary architecture may facilitate particular configurations. As a first such variation, the traces of the midplane 312 may interconnect all of the blades 304, or may only interconnect one or more subsets of blades 304 within the enclosure 316. For example, if the set of blades includes a first compute blade that communicates heavily with a first storage blade and a second compute blade that communicates heavily with a second storage blade, it may be advantageous to configure the midplane 312 as a first set of traces connecting the first compute blade and the first storage blade, and a second set of traces connecting the second compute blade and the second storage blade, thus creating two independent SAS buses rather than one SAS bus that is shared between the blade pairs. Alternatively, for blades 304 that heavily communicate, a blade SAS expander 314 of the first blade 304 may be connected to a second SAS interface of the second blade 304 with a cable, thus providing a second, dedicated SAS bus between these two blades 304 in addition to the SAS bus created through the midplane 312.

Figure 6:
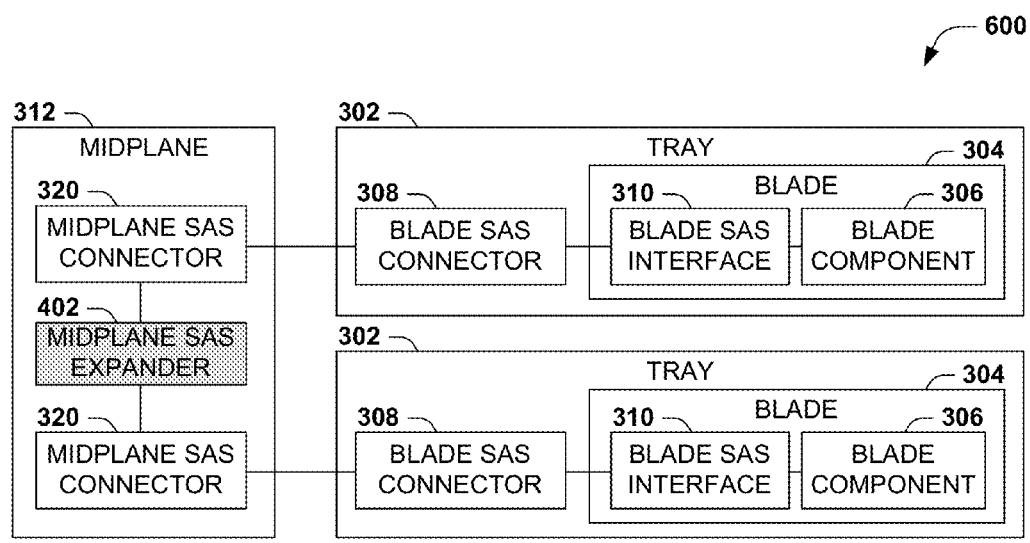
FIG. 6 is an illustration of an exemplary architectural schematic presenting a SAS topology involving a midplane SAS expander connecting with SAS interfaces of blades of respective trays.

As a second variation of this second aspect, FIG. 6 presents a second exemplary architecture, wherein the SAS expander 212 is included as a midplane SAS expander 402 of the midplane 312. In the exemplary scenario 600 of FIG. 6, two trays 302 are presented that respectively store the blade components 306 of a blade 304, and each blade 304 includes a blade SAS interface 310 that, upon insertion of the tray 302 into a slot 318 of the enclosure 316, couples directly with a midplane SAS connector 320 within the slot 318. The midplane SAS connectors 320 are connected on the midplane 312 (e.g., via traces 322) to a midplane SAS expander 402. In this manner, midplane 312 not only interconnects the blade SAS interfaces 310, blade SAS connectors 308, and midplane SAS connectors 320 to form a SAS bus for the blade components 306 of the blades 304, but also provides expansion of the SAS bus through services such as routing between SAS interfaces. This architecture may be advantageous, e.g., in a tightly integrated blade set where each blade 304 frequently communicates with many other blades 304, where routing through one centrally located SAS expander 402 provides greater efficiency and performance than routing through two or more SAS expanders 314 located on the blades 304, or where the blades 304 comprise few devices connected to the SAS blade interface 310 (e.g., where the enclosure 316 primarily stores compute blades).

Figure 7:
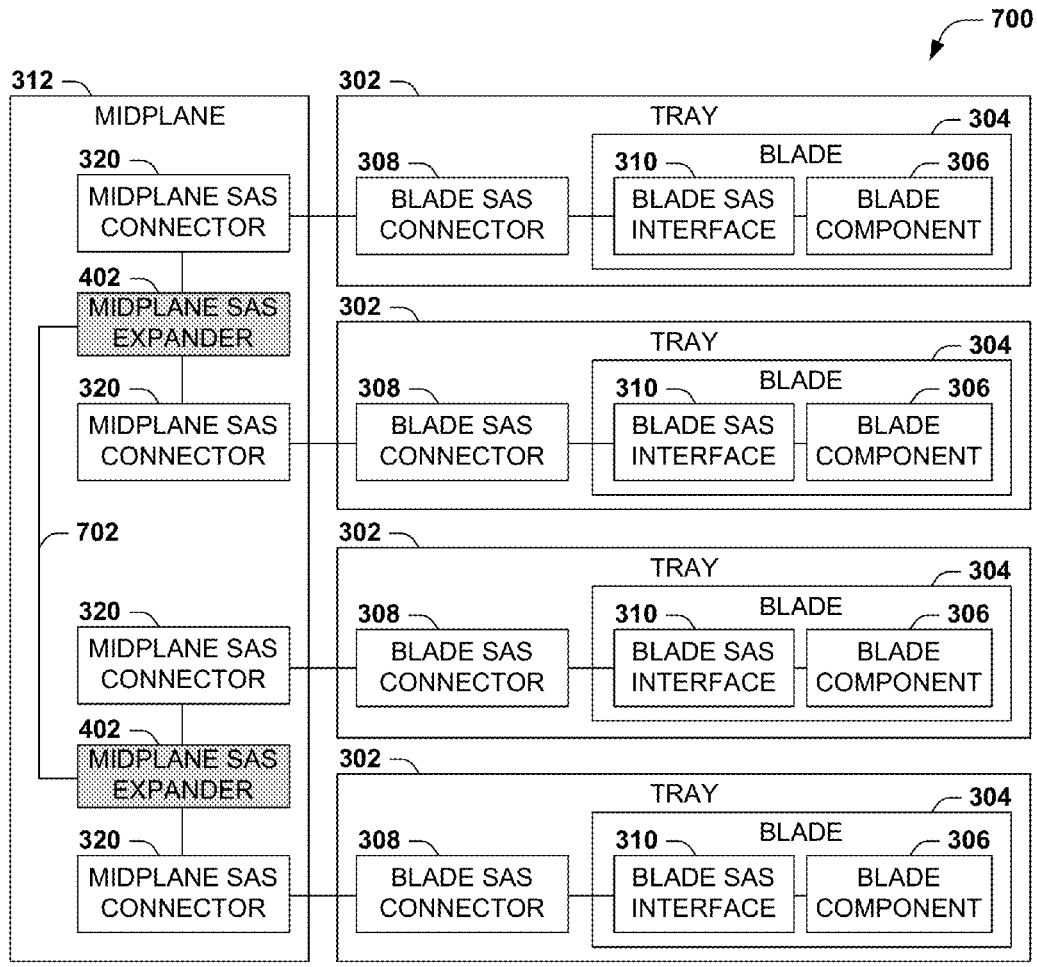
FIG. 7 is an illustration of an exemplary architectural schematic presenting a SAS topology featuring a plurality of interconnected midplane SAS expanders respectively connected with SAS interfaces on a subset of blades of respective trays.

Further variations of this second exemplary architecture may facilitate particular configurations. FIG. 7 presents a first such variation, wherein the midplane 312 comprises at least two midplane SAS expanders 402 that are respectively connected to a subset of midplane SAS connectors 320 and the blades 304 connected thereto, and a midplane SAS expander interconnect 702 that connects the midplane SAS expanders 314. In some such scenarios, one or more of the midplane SAS expanders 314 may be connected to only one midplane SAS connector 320 to connect with at least one blade 304; e.g., a dedicated midplane SAS expander 402 may be advantageous where a blade 304 is entirely filled with storage devices and cannot include a blade SAS expander 314 as a blade component 306.

Figure 8:
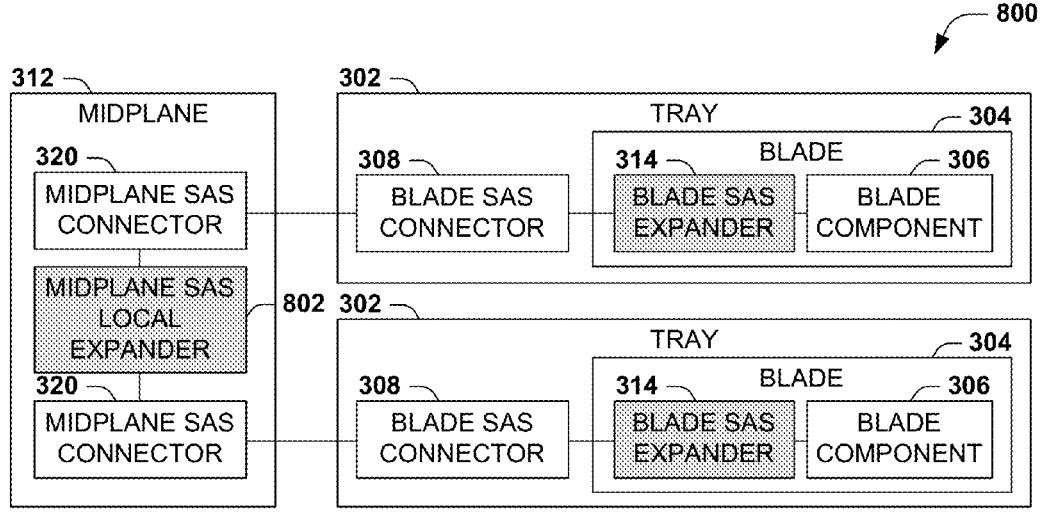
FIG. 8 is an illustration of an exemplary architectural schematic presenting a SAS topology featuring a midplane SAS local expander connected with blade SAS expanders on respective blades of respective trays.

FIG. 8 presents a second variation of this second exemplary architecture, wherein, in addition to the midplane SAS expander 402, at least one blade 304 also includes a blade SAS expander 314. In this exemplary scenario 800, the trays 302 include blades 304 comprising blade components 306 serviced by a blade SAS expander 314, and in a similar manner as the exemplary scenario 500 of FIG. 5, respective blade SAS expanders 314 are connected to the blade SAS connectors 308 that are directly coupled with the midplane SAS connectors 320 to connect to the midplane 312. However, the midplane 312 also includes a midplane SAS expander 402, which takes on the role of a midplane SAS local expander 802 to provide additional expansion (e.g., routing services) among the blade SAS connectors 308. These and other architectural variations in the sequence of the blade components 306, blade SAS connectors 308, midplane SAS connectors 320, SAS interfaces 204, and SAS expanders 212 may be devised by those of ordinary skill in the art while implementing the techniques presented herein.

C3. Midplane Architecture

A third aspect that may vary among embodiments of these techniques relates to the architecture of the midplane 312 in connecting the trays 302 and blades 304 of the enclosure 316.

As a first variation, the midplane 312 may provide one SAS bus for all of the blades 304 connected to the midplane 312. Alternatively, the midplane 312 may create two or more SAS buses for respective subsets of the blades 304, e.g., by providing distinct sets of traces 322 and/or a separate midplane SAS expander 402 to connect the blades 304 of each subset.

Figure 9:
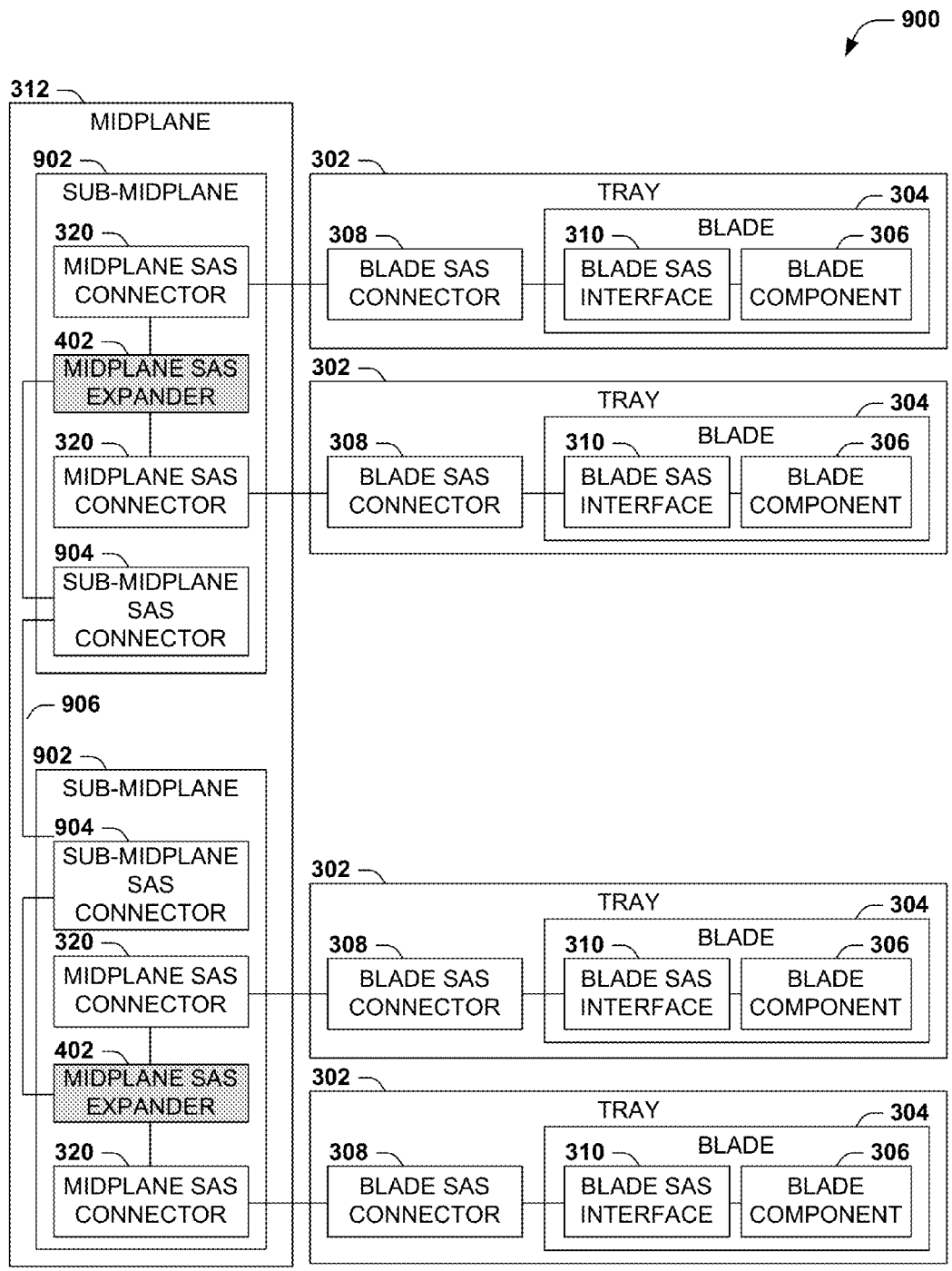
FIG. 9 is an illustration of an exemplary architectural schematic presenting a SAS topology featuring a plurality of interconnected sub-midplanes respectively comprising a sub-midplane SAS expander connected with the blades of the trays connected to the sub-midplane.

FIG. 9 presents an illustration of an exemplary scenario 900 featuring a further grouping of blades 304 by dividing the midplane 312 into two sub-midplanes 902, each servicing a subset of the blades 304 connected to the midplane 312. In this architecture, the sub-midplanes 902 may share some resources (e.g., a single power connector to a power source) as halves of a single midplane 312, but may present distinct SAS buses comprising a midplane SAS expander 402 for the sub-midplane 902 connecting the midplane SAS connectors 320 coupled with the blade SAS connectors 308 of respective blades 304. Moreover, each sub-midplanes 902 may comprise a sub-midplane SAS connector 904, which, when coupled, crate a sub-midplane SAS interconnect 906 that enables communication between the midplane SAS expanders 402. Alternatively, in architectures where the SAS expanders 212 are provided on the blades 304 as blade SAS expanders 314 and not as midplane SAS expanders 402, the sub-midplane SAS interconnect 906 may simply interconnect the traces of the sub-midplanes 902.

Figure 10:
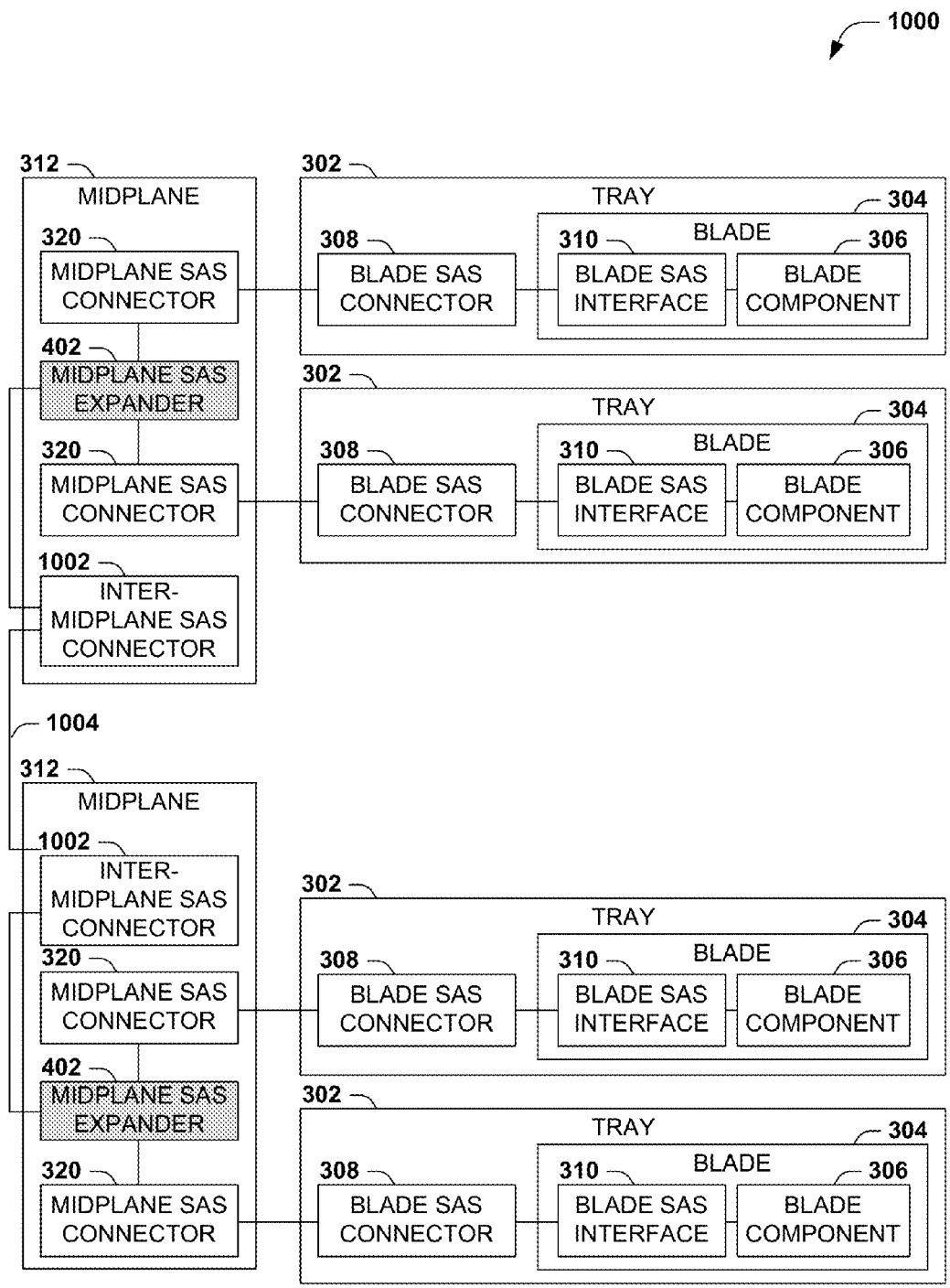
FIG. 10 is an illustration of an exemplary architectural schematic presenting a SAS topology featuring a plurality of interconnected midplanes respectively comprising a midplane SAS expander connected with the blades of the trays connected to the midplane.

Conversely, as a second variation, FIG. 10 presents an illustration of an exemplary scenario 1000 featuring an interconnection of the SAS buses of at least two midplanes 312. In this exemplary scenario 100, the enclosure 316 comprises a plurality of midplanes 312, each comprising an integrated SAS bus connecting the midplane 312 with respective blades 304 through the coupling of a midplane SAS connector 320 with the blade SAS connector 308, and through at least one SAS expander 212. However, this exemplary scenario 1000 also features an inter-midplane SAS interconnect 1004, comprising a coupling of inter-midplane SAS connectors 1002 provided on respective midplanes 312. This interconnect may connect the midplane SAS expanders 402 of respective midplanes 312, or, in in architectures where the SAS expanders 212 are provided on the blades 304 as blade SAS expanders 314 and not as midplane SAS expanders 402, may connect the traces of the midplanes 312 forming the SAS buses. In this manner, even blades 304 connected to different midplanes 312 may intercommunicate via SAS buses. Those of ordinary skill in the art may devise many such variations in the architecture of the midplanes 312 of the enclosure 316 while implementing the techniques presented herein.

D. Computing Environment

Figure 11:
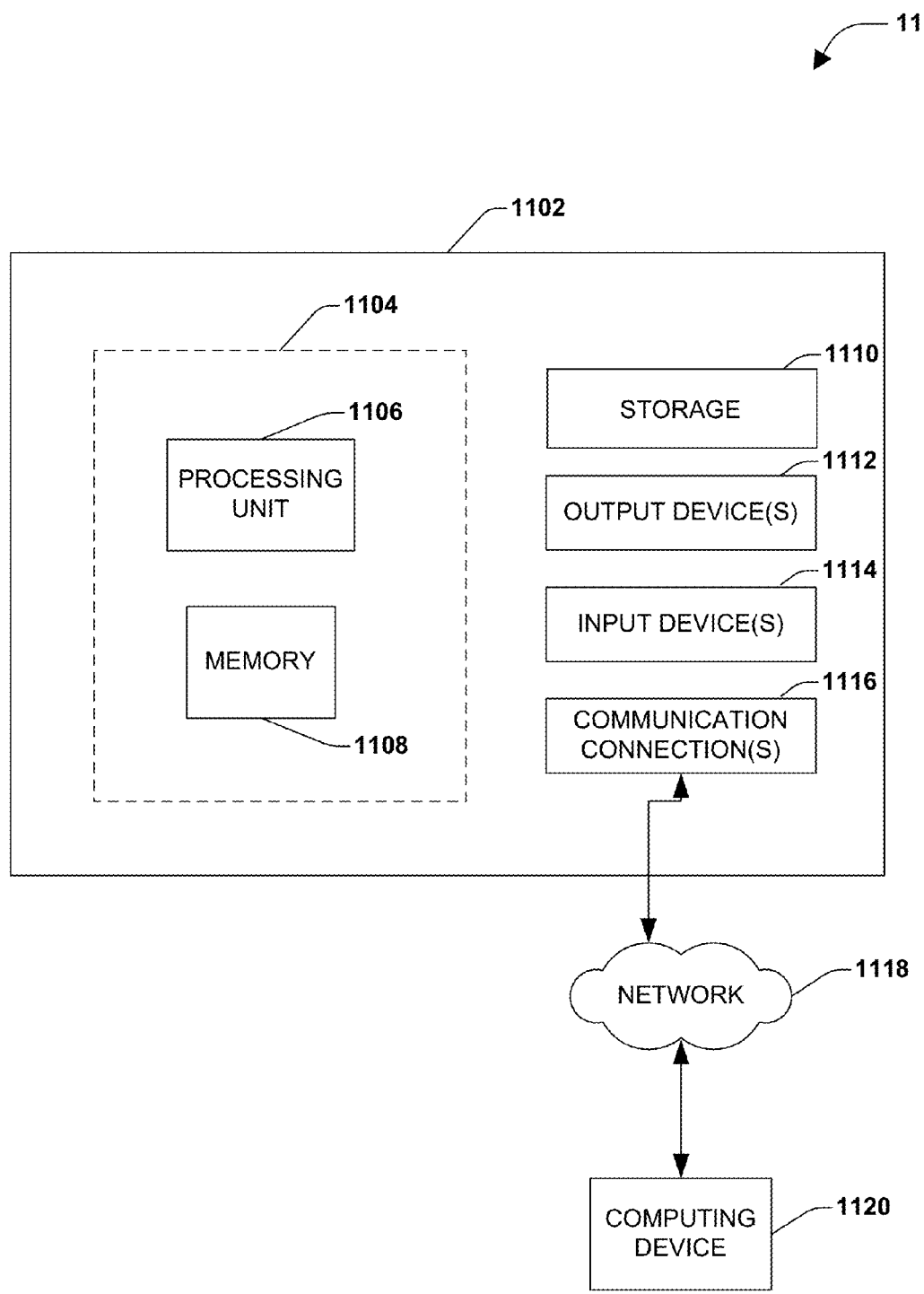
FIG. 11 is an illustration of an exemplary computing environment wherein one or more of the provisions set forth herein may be implemented.

FIG. 11 presents an illustration of an exemplary computing environment within a computing device 1102 wherein the techniques presented herein may be implemented. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, and distributed computing environments that include any of the above systems or devices.

FIG. 11 illustrates an example of a system 1100 comprising a computing device 1102 configured to implement one or more embodiments provided herein. In one configuration, the computing device 1102 includes at least one processor 1106 and at least one memory component 1108. Depending on the exact configuration and type of computing device, the memory component 1108 may be volatile (such as RAM, for example), non-volatile (such as ROM, flash memory, etc., for example) or an intermediate or hybrid type of memory component. This configuration is illustrated in FIG. 11 by dashed line 1104.

In some embodiments, device 1102 may include additional features and/or functionality. For example, device 1102 may include one or more additional storage components 1110, including, but not limited to, a hard disk drive, a solid-state storage device, and/or other removable or non-removable magnetic or optical media. In one embodiment, computer-readable and processor-executable instructions implementing one or more embodiments provided herein are stored in the storage component 1110. The storage component 1110 may also store other data objects, such as components of an operating system, executable binaries comprising one or more applications, programming libraries (e.g., application programming interfaces (APIs), media objects, and documentation. The computer-readable instructions may be loaded in the memory component 1108 for execution by the processor 1106.

The computing device 1102 may also include one or more communication components 1116 that allows the computing device 1102 to communicate with other devices. The one or more communication components 1116 may comprise (e.g.) a modem, a Network Interface Card (NIC), a radiofrequency transmitter/receiver, an infrared port, and a universal serial bus (USB) USB connection. Such communication components 1116 may comprise a wired connection (connecting to a network through a physical cord, cable, or wire) or a wireless connection (communicating wirelessly with a networking device, such as through visible light, infrared, or one or more radiofrequencies.

The computing device 1102 may include one or more input components 1114, such as keyboard, mouse, pen, voice input device, touch input device, infrared cameras, or video input devices, and/or one or more output components 1112, such as one or more displays, speakers, and printers. The input components 1114 and/or output components 1112 may be connected to the computing device 1102 via a wired connection, a wireless connection, or any combination thereof. In one embodiment, an input component 1114 or an output component 1112 from another computing device may be used as input components 1114 and/or output components 1112 for the computing device 1102.

The components of the computing device 1102 may be connected by various interconnects, such as a bus. Such interconnects may include a Peripheral Component Interconnect (PCI), such as PCI Express, a Universal Serial Bus (USB), firewire (IEEE 794), an optical bus structure, and the like. In another embodiment, components of the computing device 1102 may be interconnected by a network. For example, the memory component 1108 may be comprised of multiple physical memory units located in different physical locations interconnected by a network.

Those skilled in the art will realize that storage devices utilized to store computer readable instructions may be distributed across a network. For example, a computing device 1120 accessible via a network 1118 may store computer readable instructions to implement one or more embodiments provided herein. The computing device 1102 may access the computing device 1120 and download a part or all of the computer readable instructions for execution. Alternatively, the computing device 1102 may download pieces of the computer readable instructions, as needed, or some instructions may be executed at the computing device 1102 and some at computing device 1120.

E. Usage of Terms

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A midplane of an enclosure comprising at least two slots respectively storing a tray comprising at least one blade having a Serial Attached Small Computer System Interface ("SAS") interface connected to a blade SAS connector, the midplane comprising:

for respective blades, a midplane SAS connector dedicated to, upon insertion of a tray into a slot of the enclosure, couple directly with the blade SAS connector;

traces dedicated to coupling the midplane SAS connectors for respective trays to interconnect the SAS interfaces of respective blades, wherein the traces include electrical wires embedded in the midplane, the electrical wires directly and simultaneously connecting all of the midplane SAS connectors on the midplane to effect a permanent circuit among all of the midplane SAS connectors;

at least one SAS expander configured to connect with at least one blade component of the at least one blade of the tray via one of the SAS connectors;

at least two midplane SAS expanders respectively connected to a subset of the midplane SAS connectors, and a midplane SAS expander interconnect configured to connect the at least two midplane SAS expanders, wherein at least one of the at least two midplane SAS expanders is connected to only one midplane SAS connector of one blade of one tray.

2. The midplane of claim 1 wherein:

the midplane comprising at least two sub-midplanes respectively connecting a subset of blades of the enclosure; and respective sub-midplanes comprising a sub-midplane SAS connector configured to couple to connect the traces of the sub-midplanes.

3. The midplane of claim 1 wherein:

the enclosure comprising at least two midplanes respectively connecting a set of trays; and respective midplanes comprising an inter-midplane SAS connector configured to couple to connect the traces of the at least two midplanes.

4. The midplane of claim 1 wherein:

at least one blade component of at least one blade comprising a blade SAS expander; and at least one midplane SAS expander comprising a midplane SAS local expander configured to connect to at least one blade SAS expander.

5. The midplane of claim 1 wherein:

the enclosure comprising at least two midplanes respectively connecting a set of trays; and respective midplanes comprising an inter-midplane SAS connector configured to couple to connect the midplane SAS expanders.

6. An enclosure, comprising:

a midplane having a plurality of midplane Serial Attached Small Computer System Interface ("SAS") connectors and traces dedicated to coupling the midplane SAS connectors, wherein the traces include electrical wires embedded in the midplane, the electrical wires directly and simultaneously connecting all of the midplane SAS connectors on the midplane to effect a permanent circuit among all of the midplane SAS connectors;

at least two slots configured to individually connect with a blade that includes:

at least one blade component; and at least one blade SAS connector, wherein the blade SAS connectors are dedicated to individually couple directly with one of the midplane SAS connectors to connect the at least one blade component to the midplane; wherein:

the midplane comprising at least two SAS expanders;

the blade components of at least one blade comprising a SAS interface configured to connect to the SAS expander on the midplane through the blade SAS connector coupled with the midplane SAS connector; and the blade components of the blade are connected to one of the SAS expanders of the midplane that is connected to another SAS expander and that is not connected to the blade components of another blade.

7. The enclosure of claim 6 wherein the blade further includes a blade SAS expander as a blade component of the blade.

8. The enclosure of claim 7 wherein the at least one blade component includes at least one storage device connected with at least one other blade component of at least one other blade through the blade SAS expander.

9. The enclosure of claim 7 wherein the blade SAS expander is connected with at least one other blade component of at least one other blade through the blade SAS connector coupled with the midplane SAS connector of the midplane.

10. The enclosure of claim 9 wherein the blade SAS expander of the blade is connected with the at least one other blade component of the other blade through traces connecting the blades of the midplane.

11. The enclosure of claim 10 wherein the traces connect the blade SAS expander of the blade with a subset of blades connected to the midplane.

12. The enclosure of claim 9 wherein:

the midplane comprising a midplane SAS local expander connected to the midplane SAS connectors of respective blades;

the blade SAS connector configured to connect the blade SAS expander with the midplane SAS local expander; and the blade SAS expander is connected with the at least one other blade component through the midplane SAS local expander.

13. The enclosure of claim 9 wherein:

the enclosure comprising at least two midplanes respectively supporting a set of blades, respective midplanes interconnected through coupled inter-midplane SAS connectors; and the blade SAS expander is connected with at least one other blade component of at least one blade of at least one other midplane through the coupled inter-midplane SAS connectors.

14. The enclosure of claim 7 wherein:

at least one other blade comprising a second SAS interface; and the blade SAS expander is directly connected by a cable to the second SAS interface of the other blade.

15. The enclosure of claim 6 wherein:

the SAS expander of the midplane is connected with at least one storage device; and for at least one blade of at least one tray:

the blade components of the blade comprising at least one processor; and the SAS interface configured to connect the at least one processor with the at least one storage device through the SAS expander of the midplane.

16. An enclosure, comprising:

a midplane having a plurality of midplane Serial Attached Small Computer System Interface ("SAS") connectors and traces dedicated to coupling the midplane SAS connectors, wherein the traces include electrical wires embedded in the midplane, the electrical wires directly and simultaneously connecting all of the midplane SAS connectors on the midplane to effect a permanent circuit among all of the midplane SAS connectors;

at least two slots configured to individually connect with a blade that includes:

at least one blade component; and at least one blade SAS connector, wherein the blade SAS connectors are dedicated to individually couple directly with one of the midplane SAS connectors to connect the at least one blade component to the midplane, wherein:

the blade further includes a blade SAS expander as a blade component of the blade;

the blade SAS expander is connected with at least one other blade component of at least one other blade through the blade SAS connector coupled with the midplane SAS connector of the midplane;

the enclosure comprising at least two midplanes respectively supporting a set of blades, respective midplanes being interconnected through inter-midplane SAS connectors; and the blade SAS expander is connected with at least one other blade component of at least one blade of at least one other midplane through the coupled inter-midplane SAS connectors.

17. The enclosure of claim 16 wherein the at least one blade component includes at least one storage device connected with at least one other blade component of at least one other blade through the blade SAS expander.

18. The enclosure of claim 16 wherein the blade SAS expander of the blade is connected with the at least one other blade component of the other blade through traces connecting the blades of the midplane.

19. The enclosure of claim 16 wherein the traces connect the blade SAS expander of the blade with a subset of blades connected to the midplane.

20. The enclosure of claim 16 wherein:

the SAS expander is included in the midplane; and the blade components of at least one blade comprising a SAS interface configured to connect to the SAS expander on the midplane through the blade SAS connector coupled with the midplane SAS connector.

* * * * *